(12) United States Patent
Hwang et al.

(10) Patent No.: US 7,915,102 B2
(45) Date of Patent: Mar. 29, 2011

(54) METHODS OF FABRICATING THIN FILM TRANSISTOR AND ORGANIC LIGHT EMITTING DISPLAY DEVICE USING THE SAME

(75) Inventors: Eui-Hoon Hwang, Suwon-si (KR); Sang-Gul Lee, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 325 days.

(21) Appl. No.: 11/473,455

(22) Filed: Jun. 22, 2006

(65) Prior Publication Data
US 2006/0292763 A1 Dec. 28, 2006

(30) Foreign Application Priority Data
Jun. 23, 2005 (KR) .................. 10-2005-0054657

(51) Int. Cl.
*H01L 21/84* (2006.01)

(52) U.S. Cl. . 438/160; 438/157; 438/164; 257/E21.328; 257/E21.347

(58) Field of Classification Search .................. 438/151, 438/149, 157, 160, 164, 197; 257/E31.054, 257/E31.093, E21.328, E21.347
See application file for complete search history.

(56) References Cited

U.S. PATENT DOCUMENTS

| | | | | |
|---|---|---|---|---|
| 6,077,730 A * | 6/2000 | Lee et al. | ....................... | 438/149 |
| 6,599,785 B2 * | 7/2003 | Hamada et al. | ................ | 438/151 |
| 7,276,730 B2 * | 10/2007 | Yamazaki et al. | ............... | 257/59 |
| 7,399,704 B2 * | 7/2008 | Fujii et al. | ...................... | 438/674 |
| 2002/0182833 A1 | 12/2002 | Yang | | |
| 2004/0229415 A1 * | 11/2004 | Takehashi et al. | ............ | 438/163 |

FOREIGN PATENT DOCUMENTS

| | | |
|---|---|---|
| CN | 1091551 | 8/1994 |
| CN | 1215224 | 4/1999 |
| CN | 1389911 | 1/2003 |
| CN | 1614487 | 5/2005 |
| JP | 02-090629 | 3/1990 |
| JP | 06-267978 | 9/1994 |

(Continued)

OTHER PUBLICATIONS

Chinese Office Action issued Mar. 7, 2008 in Chinese Patent Application No. 200610093263.7.

(Continued)

*Primary Examiner* — Matthew C Landau
*Assistant Examiner* — Colleen E Snow
(74) *Attorney, Agent, or Firm* — Knobbe Martens Olson & Bear, LLP.

(57) ABSTRACT

Methods of fabricating a TFT and an OLED using the same are provided. The method of fabricating a CMOS TFT includes: preparing a substrate having first and second TFT regions; forming a gate electrode on the substrate; forming a gate insulating layer on the entire surface of the substrate including the gate electrode; forming a semiconductor layer on a predetermined region of the gate insulating layer using a mask; exposing the back of the mask using the gate electrode; injecting n-type impurity ions into the semiconductor layers of the first and second TFT regions using the back-exposed mask and forming a channel region and source and drain regions; ashing both sides of the back-exposed mask; injecting low concentration impurity ions into the semiconductor layers of the first and second TFT regions using the ashed mask and forming an LDD region; and injecting p-type impurity ions into the semiconductor layer of the second TFT region and forming source and drain regions.

18 Claims, 11 Drawing Sheets

FOREIGN PATENT DOCUMENTS

| | | |
|---|---|---|
| JP | 2000-150904 | 5/2000 |
| JP | 2000-340801 | 12/2000 |
| JP | 2002-014628 | 1/2002 |
| JP | 2003-273125 | 9/2003 |
| JP | 2005-070741 | 3/2005 |
| KR | 10-2003-0092873 A | 12/2003 |
| KR | 10-2005-0049999 A | 5/2005 |
| KR | 10-2005-0050494 A | 5/2005 |

OTHER PUBLICATIONS

Chinese Certificate of Patent for corresponding Chinese Application No. 200610093263.7 dated Jun. 10, 2009.

Office Action dated Nov. 24, 2009 of Japanese Patent Application No. 2006-174255 corresponding to Korean Patent Application No. 10-2005-0054657.

* cited by examiner

METHODS OF FABRICATING THIN FILM TRANSISTOR AND ORGANIC LIGHT EMITTING DISPLAY DEVICE USING THE SAME

CROSS-REFERENCE TO RELATED APPLICATIONS

This application claims priority to and the benefit of Korean Patent Application No. 10-2005-0054657, filed on Jun. 23, 2005, the disclosure of which is incorporated herein by reference in its entirety.

BACKGROUND OF THE INVENTION

1. Field of the Invention

The present invention relates to methods of fabricating a thin film transistor (TFT) and an organic light emitting display device (OLED) using the same, and more particularly, to methods of fabricating a TFT and an OLED using the same, that can reduce the number of masking steps.

2. Description of the Related Technology

Among flat panel display devices (FPDs), an organic light emitting display device (OLED) is an emissive device that has a wide viewing angle and a fast response speed of 1 ms or less. Also, the OLED can be fabricated to a small thickness at a low cost and has good contrast. Thus, the OLED has attracted much attention as a next generation flat panel display.

In general, the OLED is classified into a passive matrix OLED and an active matrix OLED according to the manner in which N×M pixels disposed in the form of a matrix are driven. In the active matrix type OLED, a pixel electrode defining an emission region and a unit pixel driving circuit for applying current or voltage to the pixel electrode are disposed in a unit pixel region. The unit pixel driving circuit includes at least one TFT to provide a predetermined current irrespective of pixel numbers in the OLED, so that the OLED may have stable brightness and consume low power. Thus, the active matrix type OLED may be advantageously employed to a large-sized display with high resolution.

SUMMARY OF CERTAIN INVENTIVE ASPECTS

One aspect of the invention provides a method of making a flat panel display device comprising a CMOS thin film transistor (TFT). The method comprises: providing a substrate; forming a first gate electrode for a NMOS TFT and a second gate electrode for a PMOS TFT over the substrate; forming an insulating layer over the substrate and the first and second gate electrodes; forming a semiconductor layer over the insulating layer; forming a first photoresist mask over the semiconductor layer; selectively etching the semiconductor layer using the first photoresist mask so as to form a first semiconductor layer for the NMOS TFT and a second semiconductor layer for the PMOS TFT, wherein at least a portion of the first semiconductor layer overlies the first gate electrode, and wherein at least a portion of the second semiconductor layer overlies the second gate electrode; projecting light to the first photoresist mask in a direction such that the light passes through the substrate before reaching the first photoresist mask, wherein the first and second gate electrodes block the light directed thereto, and wherein the light illuminates at least one portion of the first photoresist mask; removing the at least one portion of the first photoresist mask illuminated by the light, thereby forming a second photoresist mask; and selectively doping the first semiconductor layer using the second photoresist mask.

Doping may comprise injecting impurities into the portions of the first second semiconductor layer that are not overlapping the second photoresist mask. The impurities may comprise n-type dopants. Injecting the n-type dopants may define a source and a drain of the NMOS TFT.

The method may further comprises, after injecting the n-type dopants: removing at least a portion of the second photoresist mask, thereby forming a third photoresist mask; and further doping the first semiconductor layer using the third photoresist mask. Further doping may comprise injecting impurities into the first semiconductor layer, thereby forming lightly-doped drain (LDD) regions and a channel region interposed between the LDD regions. Removing the at least a portion of the second photoresist mask may comprise using dry ashing or wet ashing.

The method may further comprise: forming a third photoresist mask over substantially the entire portion of the first semiconductor layer and over a central portion of the second semiconductor layer, the central portion overlying the second gate electrode; and injecting p-type dopants into the second semiconductor layer using the third photoresist mask. Injecting the p-type dopants may define a source, a drain and a channel of the PMOS TFT.

The method may further comprise: forming a planarization layer over the NMOS TFT and PMOS TFT; forming at least one via hole through the planarization layer so as to expose portions of the source and drain of the NMOS TFT and PMOS TFT; and forming a conductive layer over the planarization layer and simultaneously connecting the conductive layer to the exposed portions of the NMOS TFT and PMOS TFT through the at least one via hole.

The method may further comprise forming a passivation layer over the NMOS TFT and PMOS TFT prior to forming the planarization layer, wherein the passivation layer is interposed between the planarization layer and the NMOS and PMOS TFTs. The conductive layer may comprise at least two sublayers stacked over one another. Forming the conductive layer may comprise etching portions of the at least two sublayers in a single etching process. Forming the conductive layer may further comprise simultaneously forming an anode over a portion of the planarization layer. Forming the conductive layer may further comprise simultaneously connecting the anode to one of the source and drain of the NMOS TFT and PMOS TFT.

In the method, the flat panel display device may comprise a pixel region and a non-pixel region, and the method may further comprise forming a power supply line in the non-pixel region. The power supply line may be simultaneously formed with the gate electrodes.

The method may further comprise: forming a planarization layer over the NMOS TFT and PMOS TFT; forming a via hole through the planarization layer so as to expose a portion of the source or drain of the NMOS TFT; forming a via hole through the planarization layer so as to expose a portion of the source or drain of the PMOS TFT; forming a via hole through the planarization layer and the insulating layer so as to expose a portion of the power supply line; and forming a conductive layer over the planarization layer and simultaneously connecting the conductive layer to the exposed portion of the NMOS TFT and the exposed portion of the PMOS TFT through the via holes, thereby electrically interconnecting the NMOS TFT and the PMOS TFT through the conductive line formed over the planarization layer, wherein a portion of the conductive layer fills the via hole in the non-pixel region and contacting the power supply line; and wherein forming the conductive layer may further comprise forming an interconnecting line between the CMOS TFT and the power supply line, a portion of the interconnecting line being formed over the planarization layer. The via holes may be simultaneously formed using a single photoresist mask.

Another aspect of the invention provides a flat panel display device made by the method described above. The device may comprise an organic light emitting display device.

Another aspect of the invention provides methods of fabricating a CMOS TFT and an OLED using the same, that can reduce time and cost.

Another aspect of the invention provides a method of fabricating a CMOS TFT comprises: preparing a substrate having first and second TFT regions; forming a gate electrode on the substrate; forming a gate insulating layer on the entire surface of the substrate including the gate electrode; forming a semiconductor layer on a predetermined region of the gate insulating layer using a mask; exposing the back of the mask using the gate electrode; injecting n-type impurity ions into the semiconductor layers of the first and second TFT regions using the back-exposed mask and forming a channel region and source and drain regions; ashing both sides of the back-exposed mask; injecting low concentration impurity ions into the semiconductor layers of the first and second TFT regions using the ashed mask and forming an LDD region; and injecting p-type impurity ions into the semiconductor layer of the second TFT region and forming source and drain regions.

Yet another aspect of the invention provides a method of fabricating an OLED in which unit pixel regions are defined by a plurality of signal lines disposed in a matrix, comprises: preparing a substrate having first and second TFT regions, a pixel region and an interconnection region; simultaneously forming a gate electrode on the substrate in the first and second TFT regions and signal lines in the interconnection region; forming a gate insulating layer on the entire surface of the substrate including the gate electrode and the signal lines; forming a semiconductor layer having source and drain regions injected with n-type impurity ions, a channel region and an LDD region on the gate insulating layer in the first TFT region; forming a semiconductor layer having source and drain regions injected with p-type impurity ions, and a channel region on the gate insulating layer in the second TFT region; forming an insulating layer on the substrate including the semiconductor layers; forming contact holes partially exposing the source and drain regions and the signal lines in the insulating layer; and simultaneously forming a first electrode connected with one end of the source and drain regions of the second TFT region through the contact holes in the pixel region, first source and drain electrodes connected with the other end of the source and drain regions of the second TFT region and one end of the source and drain regions of the first TFT region, and second source and drain electrodes connected with any one of the signal lines and the other end of the source and drain regions of the first TFT region.

BRIEF DESCRIPTION OF THE DRAWINGS

The above and other features of the invention will be described in reference to certain exemplary embodiments thereof with reference to the attached drawings in which.

DETAILED DESCRIPTION OF CERTAIN INVENTIVE EMBODIMENTS

The present invention will now be described more fully hereinafter with reference to the accompanying drawings, in which exemplary embodiments of the invention are shown.

A CMOS TFT includes PMOS and NMOS TFTs, so that it can implement various circuits and systems which are hard to be implemented by either the NMOS or PMOS TFT alone. The NMOS TFT of the CMOS TFT may have an LDD region to reduce a leakage current and solve a reliability problem such as a hot carrier effect caused by shrinkage of the TFT.

Figure 1A:
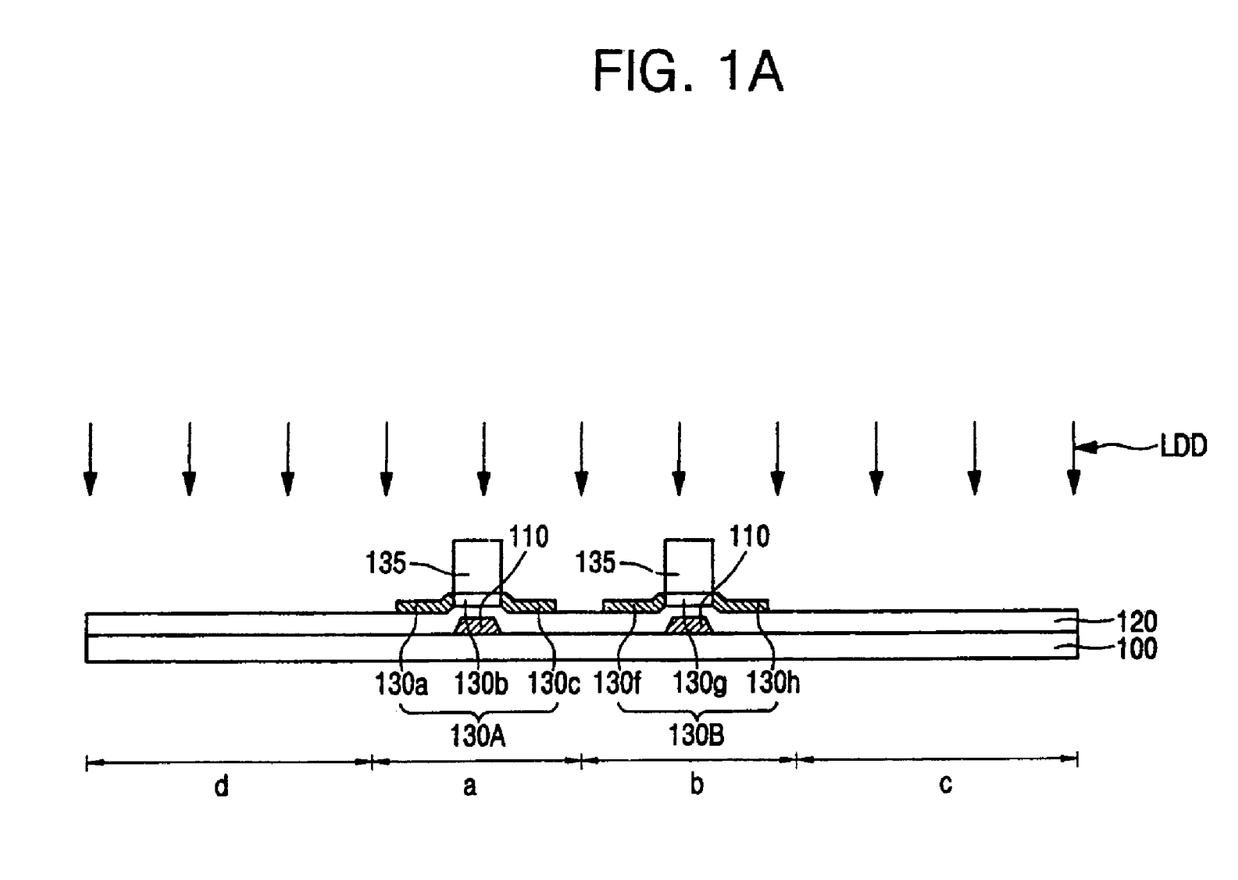
FIGS. 1A through 1D are cross-sectional views illustrating a conventional method of fabricating an OLED.

FIGS. 1A through 1D are cross-sectional views illustrating a conventional method of fabricating a bottom gate type CMOS TFT. Referring to FIG. 1A, a substrate 100 comprises a first TFT region a, a second TFT region b, a pixel region c and an interconnection region d. A gate electrode 110 is formed on the substrate in predetermined regions of the first and second TFT regions a and b using a first mask (not shown).

Further, a gate insulating layer 120 is formed over the substantially entire surface of the substrate including the gate electrode 110. Semiconductor layers 130A and 130B are formed over predetermined regions of the gate insulating layer 120 using a second mask (not shown).

A third mask 135 overlapping with the gate electrode 110 is formed on the semiconductor layers 130A and130B. Then, low concentration impurity ions are injected into the semiconductor layers 130A and 130B disposed in the first and second TFT regions. Thus, the semiconductor layers 130A and 130B have regions 130a 130c, 130f and 130h injected with the low concentration impurity ions and channel regions 130b and 130g.

Figure 1B:
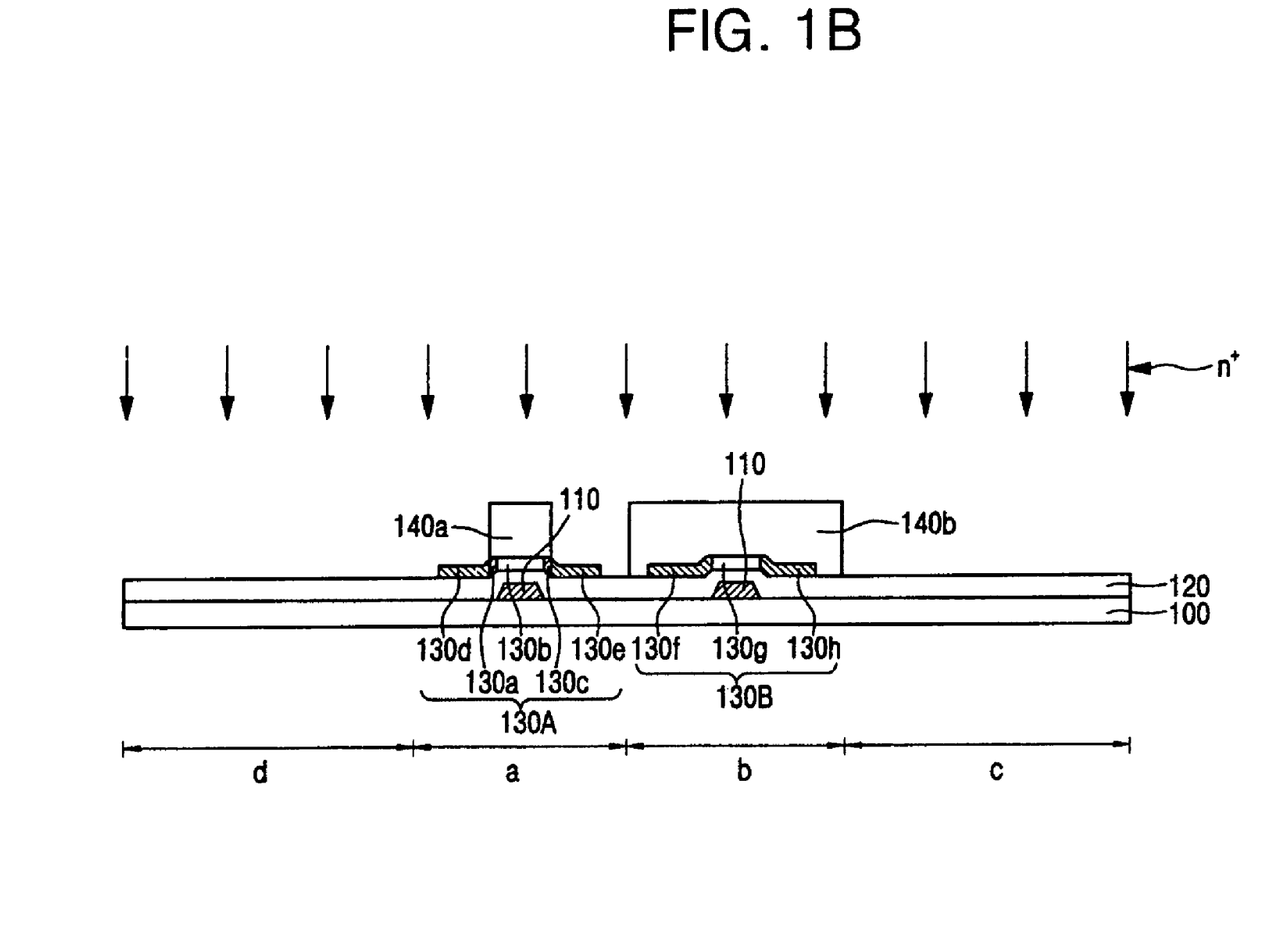

Referring to FIG. 1B, a fourth mask 140a, which is slightly wider than the channel region 130b, is formed on the semiconductor layer 130A of the first TFT region a. Another fourth mask 140b is formed to entirely cover the semiconductor layer 130B of the second TFT region b. Next, high concentration n-type impurity ions are injected into the resultant structure using the fourth masks 140a and 140b so as to form source and drain regions 130d and 130e in the first TFT region a. Thus, a bottom gate type NMOS transistor including the source and drain regions 130d and 130e, LDD regions 130a and 130c, and the channel region 130b is formed in the first TFT region a.

Figure 1C:
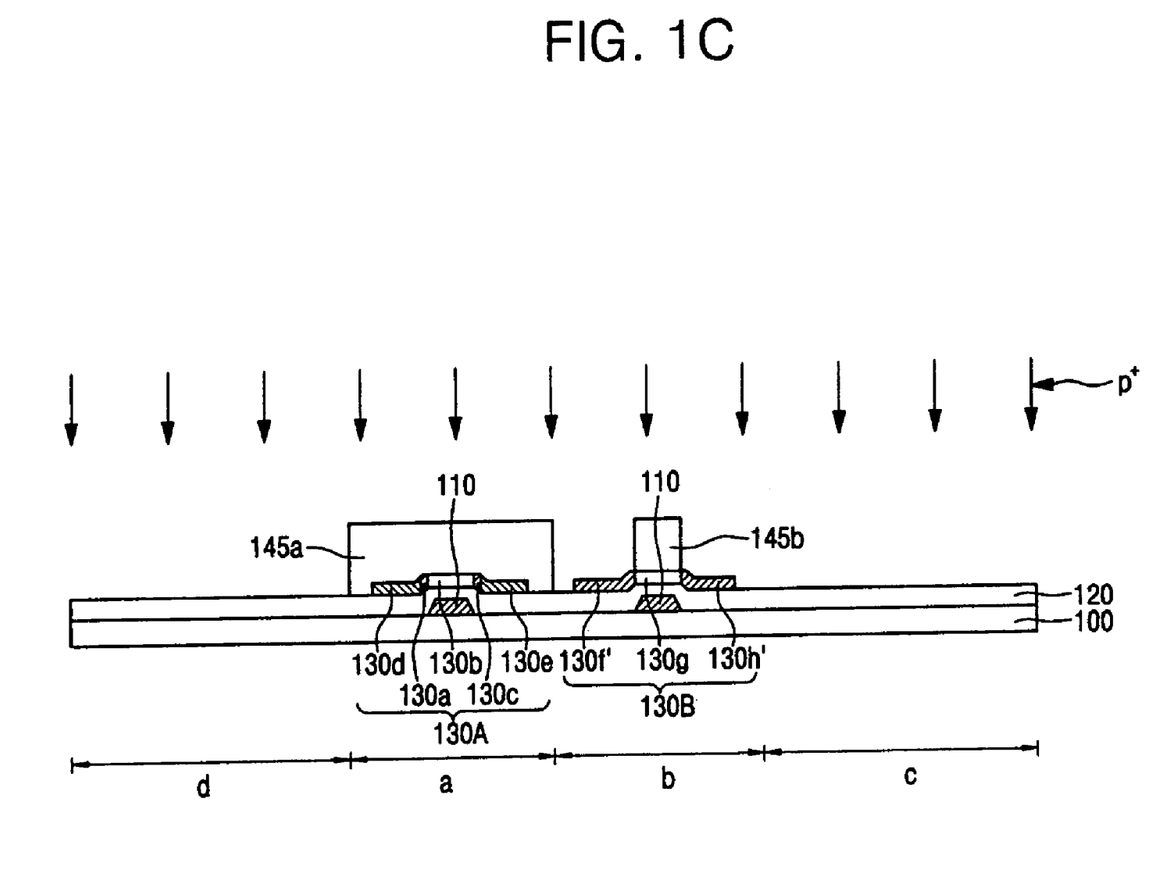

Referring to FIG. 1C, a fifth mask 145a is formed to entirely cover the semiconductor layer 130A in the first TFT region a. Another fifth mask 145b overlapping with the channel region 130b is formed in the second TFT region b. Subsequently, p-type impurity ions are injected into the resultant structure using the fifth masks 145a and 145b so as to form source and drain regions 130f' and 130h' in the second TFT region b. Thus, a bottom gate type PMOS transistor including the source and drain regions 130f' and 130h' and the channel region 130g is formed in the second TFT region b. Through the process described above, a Complementary Metal Oxide Semiconductor (CMOS) TFT is fabricated to have an NMOS transistor having an LDD region and a PMOS transistor.

Figure 1D:
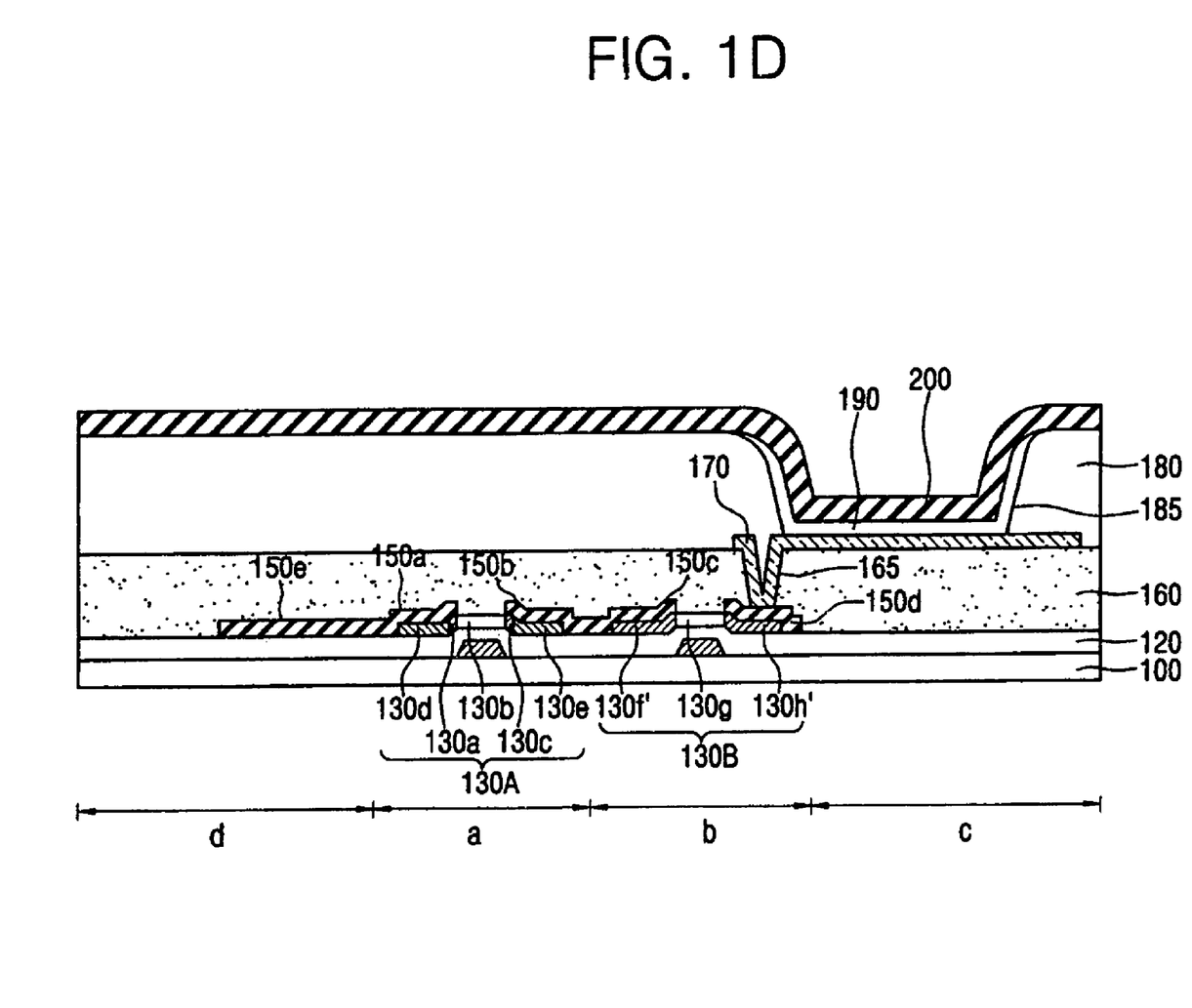

Referring to FIG. 1D, source and drain electrodes 150a, 150b, 150c and 150d, which respectively contact the source and drain regions 130d, 130e, 130f' and 130h' of the semiconductor layers 130A and 130B, are formed using a sixth mask (not shown). In addition, a common power line 150e may be simultaneously formed on the gate insulating layer 120 of the interconnection region d.

The source and drain electrodes 150a, 150b, 150c and 150d may be formed of a material with a low resistance to reduce line resistance, and formed of a multi-layer structure composed of MoW, Ti, Al or an Al alloy. The multi-layer may be a triple layer of MoW/Al/MoW, MoW/Al—Nd/MoW, Ti/Al—Nd/Ti or Ti/Al/Ti.

Subsequently, an insulating layer 160 is formed on the substantially entire surface of the substrate including the source and drain electrodes 150a, 150b, 150c and 150d and the common power line 150e. The insulating layer 160 serves to insulate a first electrode (anode) to be formed later from the source and drain electrodes 150a, 150b, 150c and 150d, and may be used for a passivation layer or a planarization layer.

A via hole 165 is formed to partially expose the source and drain electrode 150d using a seventh mask (not shown) in the insulating layer 160.

Then, a reflective layer and a transparent conductive layer are stacked on the insulating layer 160 as first electrode materials, and a first electrode 170 is connected to one of the source and drain electrodes 150d exposed through the via hole 165. The first electrode 170 may be formed using a eighth mask (not shown) for the reflective layer and a ninth mask (not shown) for the transparent layer.

A pixel defining layer 180 having an opening 185 partially exposing the first electrode 170 is formed using a tenth mask (not shown) over the substantially entire surface of the substrate including the first electrode 170. An organic emission layer 190 is formed in the opening 185 and a second electrode (cathode) 200 is formed on the organic emission layer 190. The substrate is encapsulated with an upper substrate, and thus an OLED is completed.

To implement an OLED having a CMOS TFT as described above, PMOS and NMOS TFTs should be formed on one substrate, so that relatively many processes and 10 masks are required.

In particular, since the NMOS TFT of a CMOS TFT may have an LDD region to reduce leakage current and solve a reliability problem such as a hot carrier effect caused by shrinkage of the TFT, the process becomes complicated so that tact time of the process becomes longer, and the material and production costs are increased due to an increase in the number of masks.

Figure 2A:
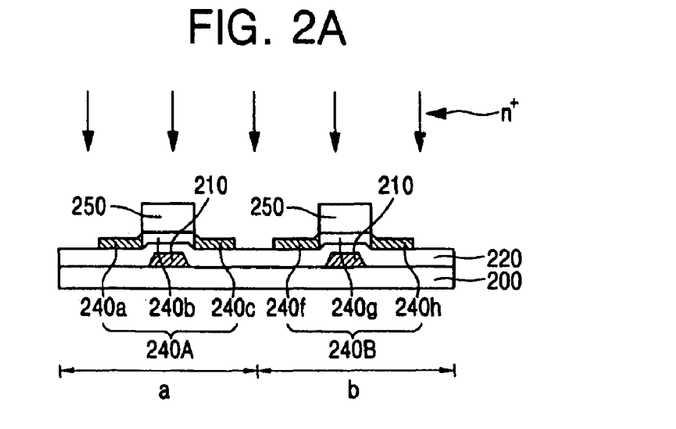
FIGS. 2A through 2C are cross-sectional views illustrating a method of fabricating a CMOS TFT according to an embodiment.
Figure 2B:
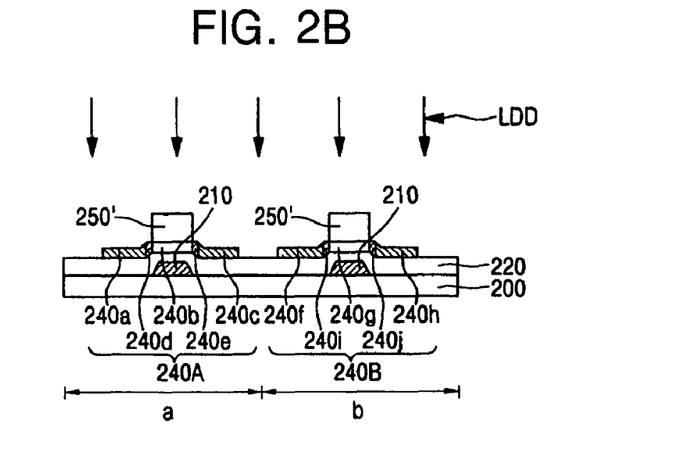
Figure 2C:
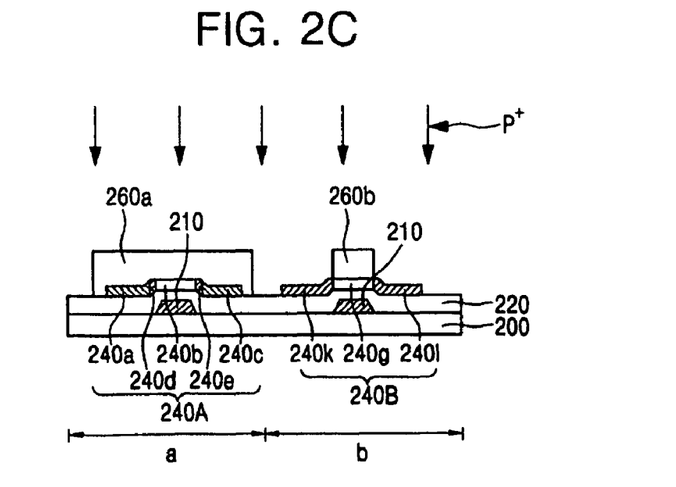

FIGS. 2A through 2C are cross-sectional views illustrating a method of fabricating a CMOS TFT according to an embodiment. Referring to FIG. 2A, a substrate 200 having a first TFT region a and a second TFT region b is provided. Gate electrodes 210 are formed in predetermined regions of the first and second TFT regions a and b using a first mask (not shown). In one embodiment, the substrate 200 is a transparent substrate formed of, for example, glass, plastic or quartz. The gate electrode 210 may be formed of one of MoW, Mo, W, WSi$_2$, MoSi$_2$ and Al by sputtering or vacuum deposition.

A gate insulating layer 220 may be formed over the substantially entire surface of the substrate, covering the gate electrode 210. The gate insulating layer 220 may be a silicon oxide layer, a silicon nitride layer or a composite layer thereof. The gate insulating layer 220 may be formed using plasma-enhanced chemical vapor deposition (PECVD), low-pressure chemical vapor deposition (LPCVD) and so on.

Further, semiconductor layers 240A and 240B may be formed over the gate insulating layer 220 in the first and second TFT regions a and b, using a second mask (not shown). The semiconductor layers 240A and 250B may be formed of amorphous silicon or polycrystalline silicon. The second mask (not shown) covers the substantially entire portion of the semiconductor layers 240A and 240B after the layers 240A and 240B have been patterned.

Then, the second mask is patterned again to have a reduced width. In the illustrated embodiment, a back exposure process is employed. A light is irradiated from under the transparent substrate 200. The light passes through the substrate 200, the gate insulating layer 220, and the semiconductor layers 240A and 240B, and reaches the second mask.

The second mask (not shown) may be formed of a photoresist. The photoresist may include a solvent for adjusting viscosity, a photo active compound sensitive to UV light, a polymer resin as a chemical bonding material, etc. When the photoresist is a positive type, a part exposed to light is converted into a material which can be removed by a developer.

When the back-exposure is performed on the second mask (not shown), the gate electrodes 210 block the light coming from under the substrate 200. Thus, the gate electrodes 210 prevent the light from reaching portions of the second mask which overlie the gate electrodes 210. On the other hand, other portions of the second mask are exposed to the light, and are converted into the material which can be removed by a developer. Then, the second mask is developed by a developer, leaving only the portions 250 overlying the gate electrodes 210. Thus, the second mask may be patterned without an additional masking step by performing the back-exposure, thereby reducing one masking step.

Then, n-type impurity ions are injected into the semiconductor layers 240A and 240B using the second mask 250 so as to form source and drain regions 240a, 240c, 240f and 240h, and channel regions 240b and 240g. The n-type impurity may be selected from the group consisting of phosphorus (P), arsenic (As), antimony (Sb) and bismuth (Bi).

Referring to FIG. 2B, the size of the second mask may be further shrunk by performing ashing on both sides of the second mask 250. The resulting mask 250' has a length shorter than those of the channel regions 240b and 240g, as shown in FIG. 2.

Generally, the term "ashing" refers to a process for removing a used photoresist (PR) after a photolithography process. Ashing includes dry ashing which uses oxygen plasma or ozone, and wet ashing which uses a mixed solution of heated sulfuric acid. and peroxide. The ashing according to the embodiment can be either dry or wet ashing. In one embodiment, the ashing is performed until the second mask 250 has a critical dimension (CD) loss of about 0.3 to about 1 µm. As described above, the second mask 250' is patterned by ashing the second mask, thereby reducing one more masking step.

Low concentration impurity ions are injected using the second mask 250' so as to form LDD regions 240d, 240e, 240i and 240j which are interposed between the source and drain regions 240a, 240c, 240f and 240h, and the channel regions 240b and 240g. In one embodiment, the LDD regions 240d, 240e, 240i and 240j are formed to have a length of about 0.3 to about 1 µm using the second mask 250'.

The LDD regions 240d, 240e, 240i and 240j are formed to improve properties of a TFT, and include n-type impurity ions, for example PH$_3$. The impurity ions injected into the LDD regions have a low concentration compared to the n-type impurity ions, so that the source and drain regions 240a, 240c, 240f and 240h of the semiconductor layers 240A and 240B with high-concentration n-type impurity ions are rarely affected.

Thus, bottom gate-type NMOS transistors, which include the source and drain regions 240a, 240c, 240f and 240h, the channel regions 240b and 240g and LDD regions 240d, 240e, 240i and 240j, are formed in first and second TFT regions.

Referring to FIG. 2C, a third mask 260a is formed to entirely cover the first TFT region, and another third mask 260b is formed over the channel region of the second TFT region.

P-type impurity ions are injected into the semiconductor layer 240B of the second TFT region b using the third masks 260a and 260b. P-type impurity ions having a higher concentration than the n-type impurity ions are injected into the LDD regions and the source and drain regions injected with the n-type impurity ions so as to form source and drain regions 240k and 240l, and thus a PMOS transistor is formed in the second TFT region. As a result, a CMOS TFT, which has the NMOS and the PMOS having LDD regions, is completed using three masks.

Next, a method of fabricating an organic light emitting display device (OLED) using the CMOS TFT will now be described. FIGS. 3A to 3F are cross-sectional views illustrating a method of fabricating an OLED using a CMOS TFT according to an embodiment.

Figure 3A:
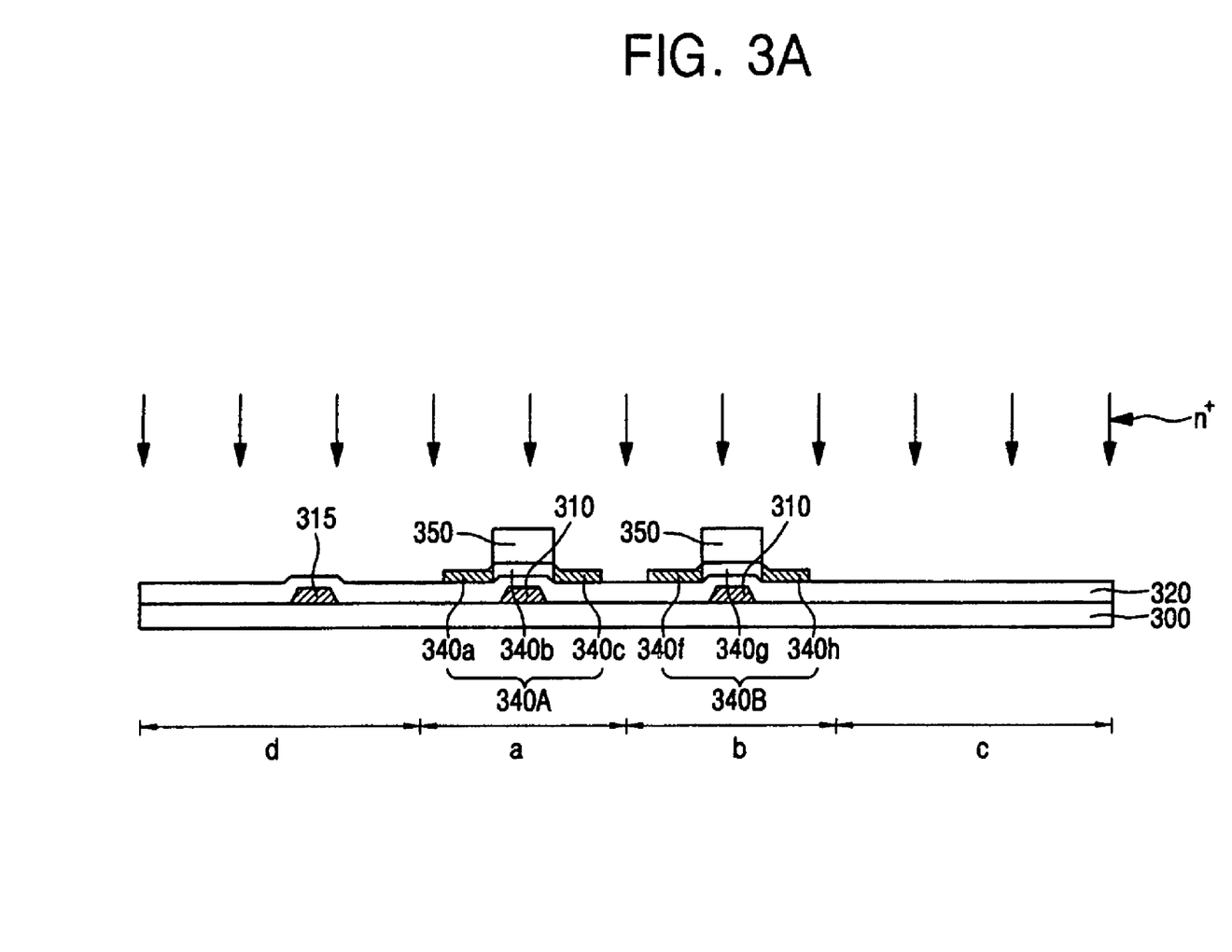
FIGS. 3A to 3F are cross-sectional views illustrating a method of fabricating an OLED using a CMOS TFT according to an embodiment.

Referring to FIG. 3A, a substrate 300 having a first TFT region a, a second TFT region b, an opening region c, and an interconnection region d is provided. Then, gate electrodes 310 are formed in the first, second and interconnection regions a, b and d using a first mask (not shown), while forming a common power line 315, a data line (not shown) and a scan line (not shown) in the interconnection region d. The gate electrodes 310, the common power line 315 and the like may be formed of one of MoW, Mo, W, $WSi_2$, $MoSi_2$ and Al, using sputtering or vacuum deposition.

Subsequently, a gate insulating layer 320 may be formed over the substantially entire surface of the substrate including the gate electrodes 310 and the common power line 315, etc.

Semiconductor layers 340A and 340B are formed on the gate insulating layer 320 in the first and second TFT regions a and b, using a second mask (not shown). Then, the second mask (not shown) is back-exposed so as to form a second mask 350 which overlie the gate electrode 310. Here, the second mask may be patterned without an additional mask by performing the back-exposure, and thus one mask can be reduced.

N-type impurity ions are injected into the semiconductor layers 340A and 340B using the second mask so as to form source and drain regions 340a, 340c, 340f and 340h and channel regions 340b and 340g.

Figure 3B:
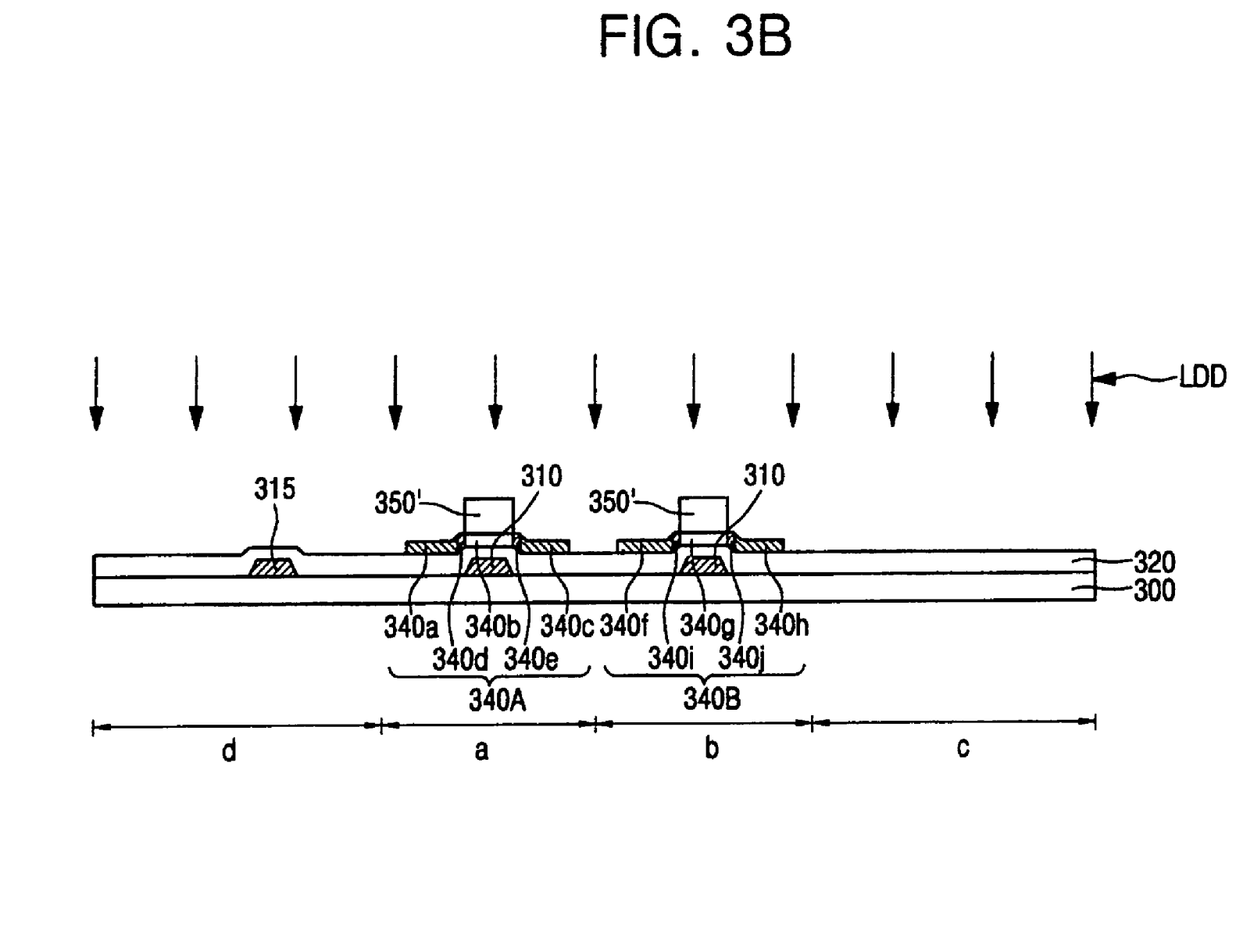

Referring to FIG. 3B, both sides of the second mask 350 are ashed so as to form mask 350' smaller in length than the channel regions 340b and 340g. Here, the second mask is ashed without an additional mask, thereby reducing one mask, compared to the conventional method described above.

Low concentration impurity ions are injected using the second mask 350' so as to form LDD regions 340d, 340e, 340i and 340j between the source and drain regions 340a, 340c, 340f and 340h, and the channel regions 340b and 340g. Consequently, a bottom gate-type NMOS transistor including the source and drain regions 340a, 340c, 340f and 340h, the channel regions 340b and 340g and the LDD regions 340d, 340e, 340i and 340j is formed in the first and second TFT regions.

Figure 3C:
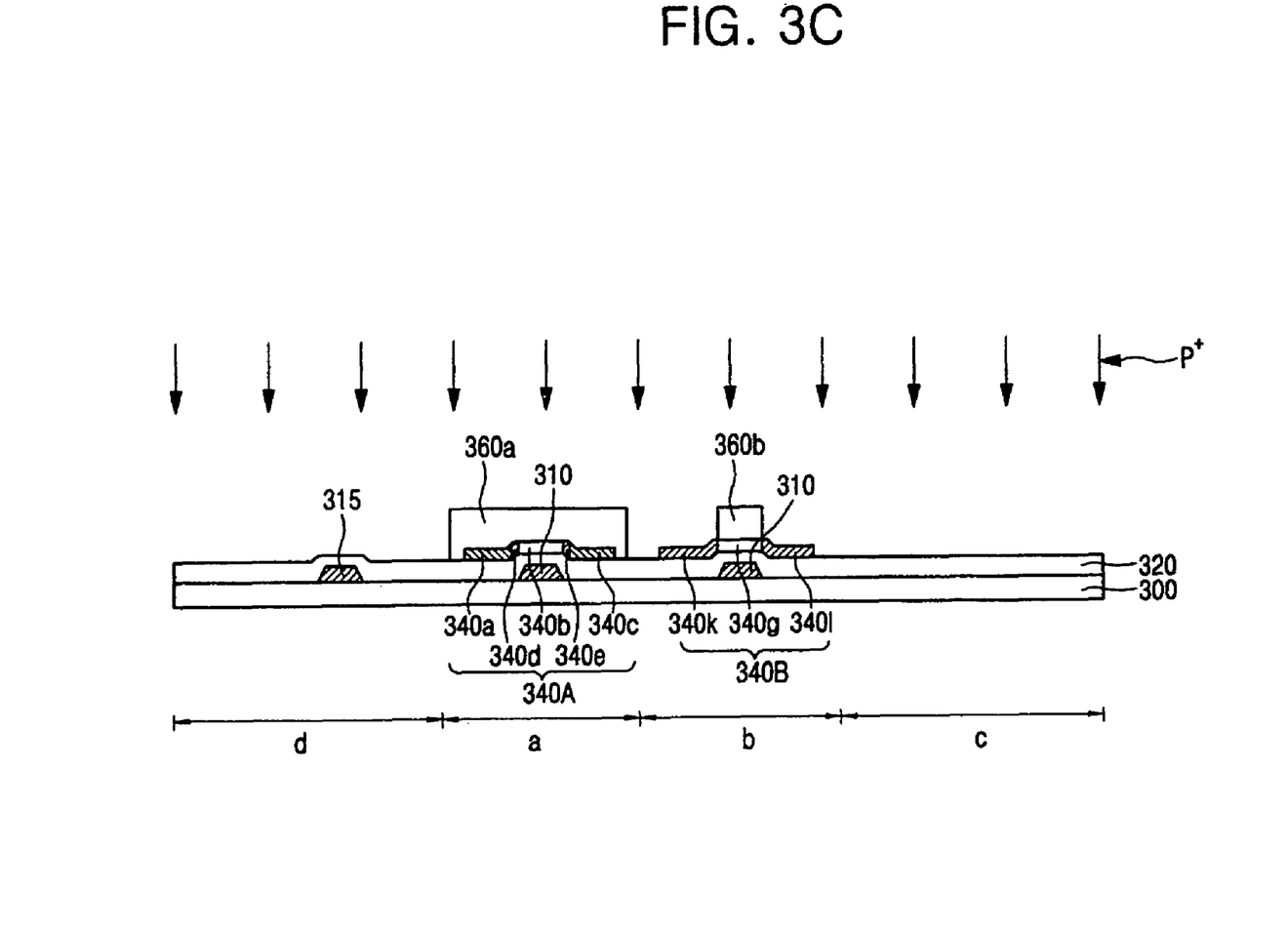

Referring to FIG. 3C, a third mask 360a is formed to substantially entirely cover the first TFT region. Another third mask 360b is formed over the channel region of the second TFT region.

Then, p-type impurity ions are injected into the semiconductor layer 340B in the second TFT region b using the 3ath and 3bth masks. The p-type impurity ions having a higher concentration than the n-type impurity ions are injected into the source and drain regions and the LDD regions which have been injected with the n-type impurity ions. This step forms source and drain regions 340k and 340l. Thus, a PMOS transistor is formed in the second TFT region.

Figure 3D:
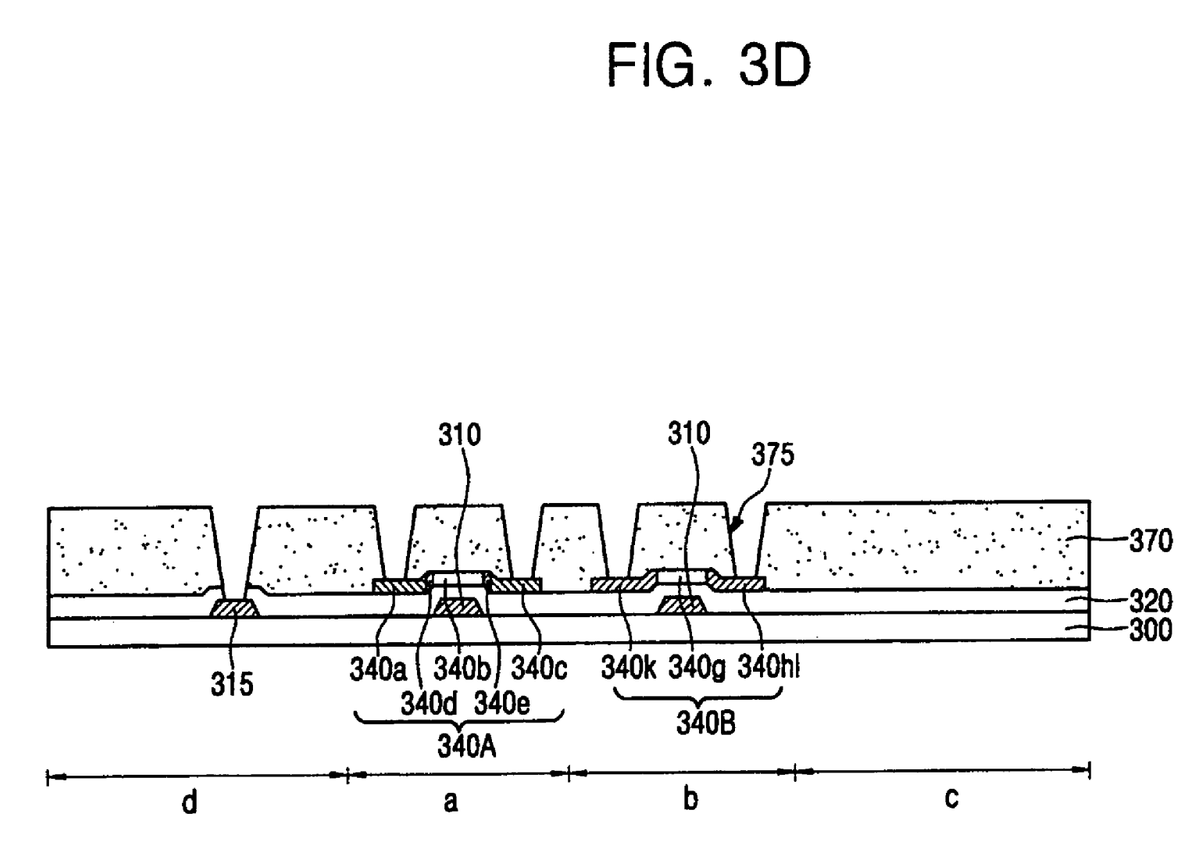

Referring to FIG. 3D, an insulating layer 370 is formed over the substrate having the semiconductor layers 340A and 340B. The insulating layer 370 may be a passivation layer, which is formed to protect a CMOS TFT from contamination and formed of an inorganic insulating layer such as a silicon nitride layer, a silicon oxide layer or a composite layer thereof. In another embodiment, the insulating layer 370 may be a planarization layer. The planarization layer 370 is formed to fill step, and commonly formed of an organic-based material selected from the group consisting of benzocyclobutene BCB, polyimide PI, polyamide PA, acryl resin and phenol resin.

Further, the insulating layer 370 may be etched using a fourth mask (not illustrated) so as to form contact holes 375 partially exposing the common power line 315, and the source and drain regions 340a, 340c, 340k and 340l.

Figure 3E:
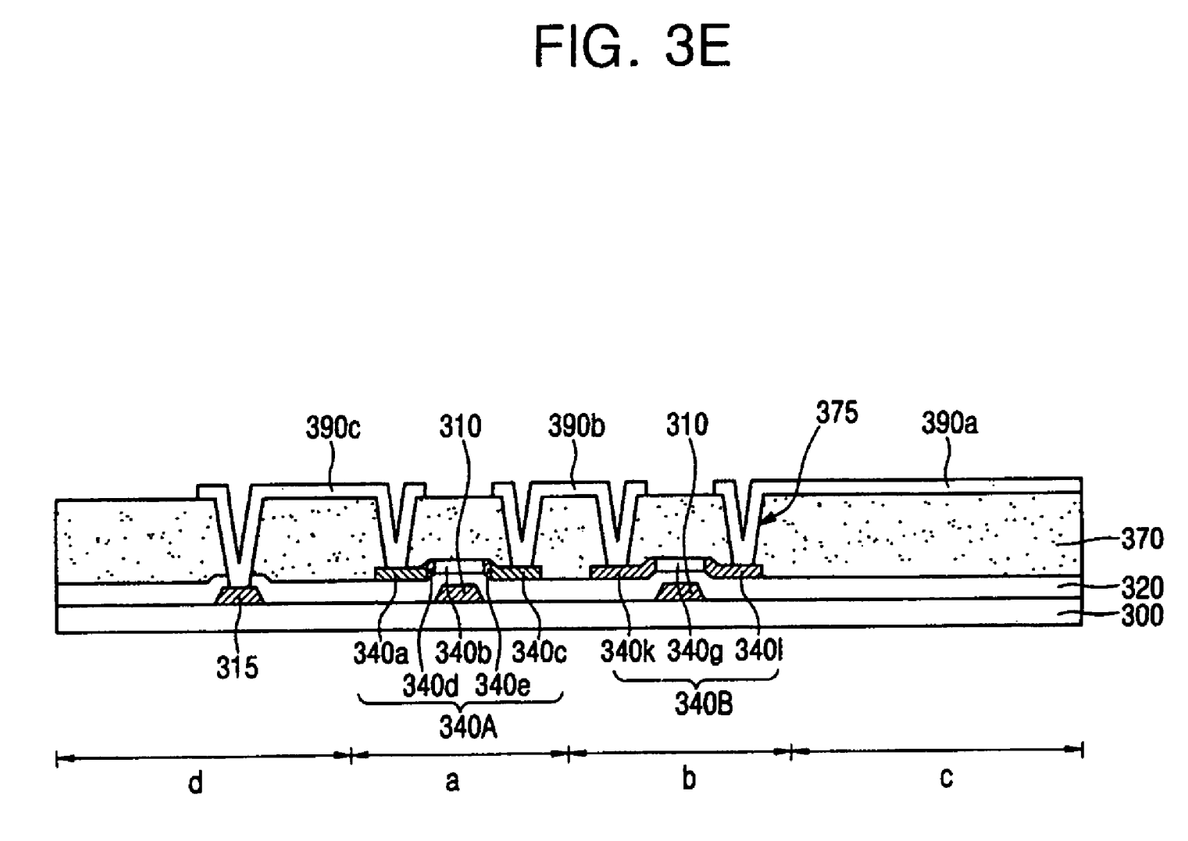

Referring to FIG. 3E, a first electrode (anode) material is disposed over the substantially entire surface of the substrate, and then is patterned using a fifth mask (not shown) so as to form a first electrode 390a while forming first and second source and drain electrodes 390b and 390c.

The first electrode is disposed on the insulating layer 370 in the pixel region c, and extends to the second TFT region b so as to contact one end 340l of the source and drain regions through the contact hole 375.

The first source/drain electrode 390b is disposed on the insulating layer 370, contacts the other end 340k of the source and drain regions in the second TFT region b through the contact hole 375, and extends to the first TFT region a so as to contact one end 340c of the source and drain regions through the contact hole 375.

The second source/drain electrode 390c is disposed on the insulating layer 370, contacts the other end 340a of the source and drain regions in the first TFT region a through the contact hole 375, and extends to the interconnection region d so as to contact the common power line 315 through the contact hole 375.

In one embodiment, the first electrode 390a and the first and second source/drain electrodes 390b and 390c include a transparent conductive layer and a reflective layer stacked over each other. The transparent conductive layer may be formed of ITO or IZO. The reflective layer may be formed of one selected from the group consisting of Al, an Al alloy, silver and a silver alloy, which have a high reflectivity property. Optionally, the reflective layer may be formed of silver or a silver alloy. If the reflective layer is formed of silver or a silver alloy having high reflectivity, reflection efficiency of the first electrode may be increased.

In an embodiment where the reflective layer is formed of silver or a silver alloy, the reflective layer and the transparent conductive layer can be blanket-etched, so that one mask can be reduced compared to the conventional method described above.

Figure 3F:
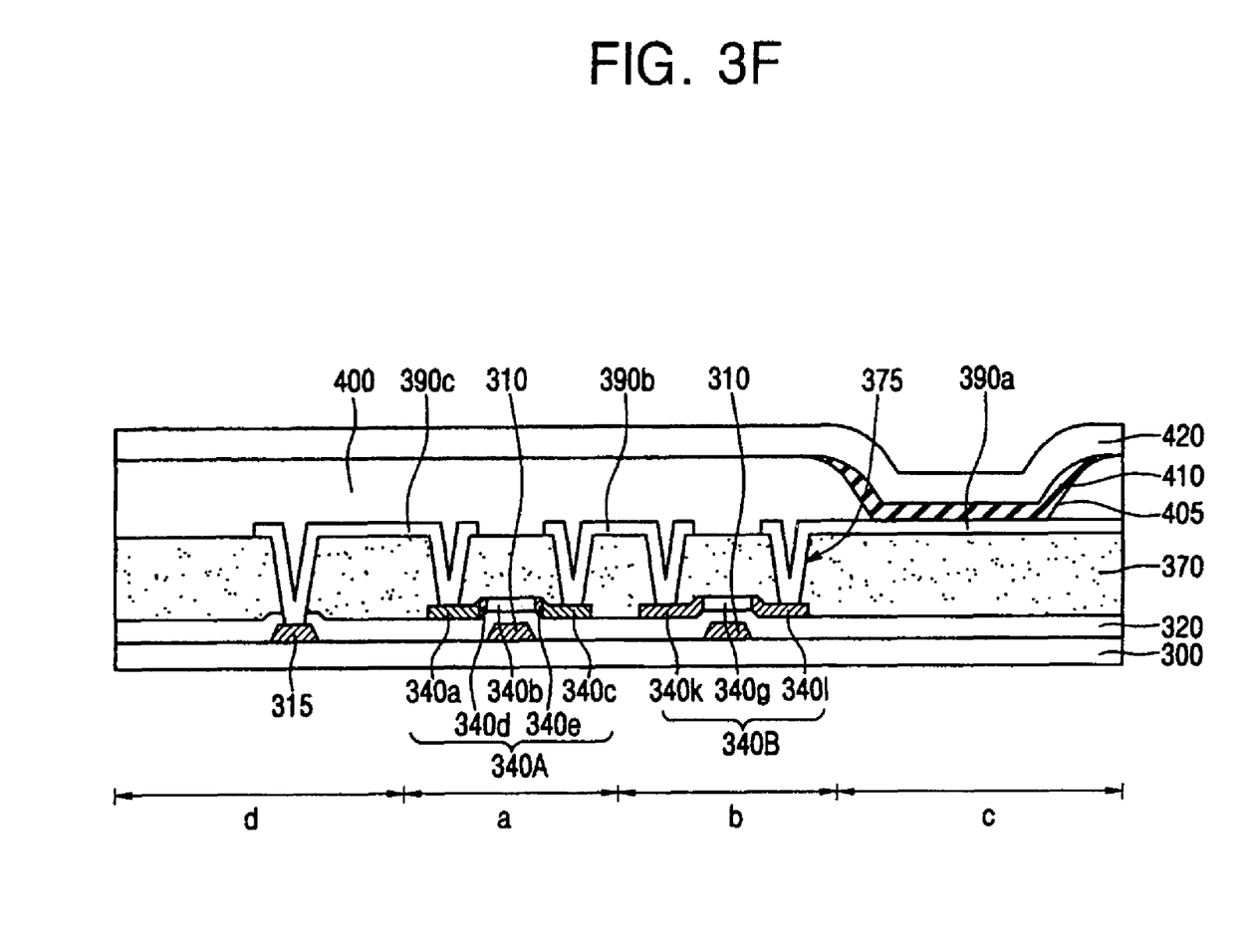

Referring to FIG. 3F, a pixel defining layer PDL 400 is formed to include an opening 405 partially exposing the surface of the first electrode 390a, using a sixth mask (not shown).

Further, an organic layer 410 including at least an organic emission layer is formed in the opening 405. The organic emission layer may be formed of a small molecular material or a polymer. The small molecular material may be selected from the group consisting of Alq3, Anthracene, cyclopentadiene, ZnPBO, Balq and DPVBi. The polymer may be selected from the group consisting of polythiophene PT, poly (p-phenylenevinylene) PPV, polyphenylene PPP and their derivatives. The organic layer may further include at least one of an electron injection layer EIL, an electron transport layer ETL, a hole transport layer HTL and a hole injection layer HIL in addition to the organic emission layer.

A second electrode 420 may be formed over the organic layer 410. The second electrode is a thin transmission electrode which is formed of a material selected from the group consisting of Mg, Ca, Al, Ag and an alloy thereof by vacuum deposition. Subsequently, the substrate is encapsulated with an upper substrate, and thus an OLED is completed.

As described above, in the method of fabricating an OLED according to the embodiments, the second mask used to pattern the semiconductor layer is back-exposed and ashed so as to form a CMOS TFT without an additional mask. Thus, two masking steps can be reduced compared to the conventional method described above.

Further, the embodiments employ silver or a silver alloy having low resistivity and a transparent conductive layer as a first electrode material so as to simultaneously form a first electrode and first and second source and drain electrodes. Thus, one more masking step may be reduced.

In addition, it is possible to blanket-etch the silver or silver alloy and the transparent conductive layer. Thus, another masking step may be further reduced.

Consequently, the embodiments can improve yield by simplifying the conventional process, and lower production cost by reducing four masks compared to the conventional method.

In the method of fabricating a CMOS TFT and an OLED using the same according to the embodiments, a process is simplified and the number of masks is reduced, and thus yield is increased while production cost is reduced.

While it is described with reference to exemplary embodiments, it will be understood by those of ordinary skill in the art that various changes in form and details may be made without departing from the spirit and scope of the present invention as set forth in the following claims.

What is claimed is:

1. A method of making a flat panel display device comprising a CMOS thin film transistor (TFT), the method comprising:
    providing a substrate;
    forming a first gate electrode and a second gate electrode over the substrate;
    forming an insulating layer over the substrate and the first and second gate electrodes;
    forming a semiconductor layer over the insulating layer;
    forming a conductive layer over the semiconductor layer, wherein the conductive layer comprises at least two sublayers stacked over one another, and wherein forming the conductive layer comprises etching portions of the at least two sublayers in a single etching process;
    forming a photoresist mask having a first pattern over the semiconductor layer;
    selectively etching the semiconductor layer using the first pattern of the photoresist mask so as to form a first semiconductor layer and a second semiconductor layer, wherein at least a portion of the first semiconductor layer overlies the first gate electrode, and wherein at least a portion of the second semiconductor layer overlies the second gate electrode;
    projecting light to the first pattern of the photoresist mask in a direction such that the light passes through the substrate before reaching the first pattern of the photoresist mask, wherein the first and second gate electrodes block the light directed thereto, and wherein the light illuminates at least one portion of the first pattern of the photoresist mask;
    removing the at least one portion of the first pattern of the photoresist mask illuminated by the light, thereby forming a second pattern in the photoresist mask, wherein the second pattern is different from the first pattern; and
    selectively doping the first and second semiconductor layers with the second pattern of the photoresist mask, the first and second semiconductor layers having been previously formed with the first pattern of the photoresist mask.

2. The method of claim 1, wherein doping the first and second semiconductor layers comprises injecting impurities into portions of the first and second semiconductor layers that are not overlapping the second pattern of the photoresist mask.

3. The method of claim 2, wherein the impurities comprise n-type dopants.

4. The method of claim 3, wherein injecting the n-type dopants defines a source and a drain of an NMOS TFT.

5. The method of claim 4, further comprising:
    forming a third photoresist mask over substantially the entire portion of the first semiconductor layer and over a central portion of the second semiconductor layer, the central portion overlying the second gate electrode; and
    injecting p-type dopants into the second semiconductor layer using the third photoresist mask.

6. The method of claim 5, wherein injecting the p-type dopants defines a source, a drain and a channel of a PMOS TFT.

7. The method of claim 6, further comprising:
    forming a planarization layer over the NMOS TFT and PMOS TFT;
    forming at least one via hole through the planarization layer so as to expose portions of the source and drain of the NMOS TFT and PMOS TFT; and
    forming the conductive layer over the planarization layer and simultaneously connecting the conductive layer to the exposed portions of the NMOS TFT and PMOS TFT through the at least one via hole.

8. The method of claim 7, further comprising forming a passivation layer over the NMOS TFT and PMOS TFT prior to forming the planarization layer, wherein the passivation layer is interposed between the planarization layer and the NMOS and PMOS TFTs.

9. The method of claim 7, wherein forming the conductive layer further comprises simultaneously forming an anode over a portion of the planarization layer.

10. The method of claim 9, wherein forming the conductive layer further comprises simultaneously connecting the anode to one of the source and drain of the NMOS TFT and PMOS TFT.

11. The method of claim 6, further comprising:
    forming a planarization layer over the NMOS TFT and PMOS TFT;
    forming a via hole through the planarization layer so as to expose a portion of the source or drain of the NMOS TFT;
    forming a via hole through the planarization layer so as to expose a portion of the source or drain of the PMOS TFT;
    forming a via hole through the planarization layer and the insulating layer so as to expose a portion of the power supply line; and
    forming a conductive layer over the planarization layer and simultaneously connecting the conductive layer to the exposed portion of the NMOS TFT and the exposed portion of the PMOS TFT through the via holes, thereby electrically interconnecting the NMOS TFT and the PMOS TFT through the conductive line formed over the planarization layer, wherein a portion of the conductive layer fills the via hole in the non-pixel region and contacting the power supply line; and wherein forming the conductive layer further comprises forming an interconnecting line between the CMOS TFT and the power supply line, a portion of the interconnecting line being formed over the planarization layer.

12. The method of claim 11, wherein the via holes are simultaneously formed using a single photoresist mask.

13. The method of claim 1, wherein the flat panel display device comprises a pixel region and a non-pixel region, wherein the method further comprises forming a power supply line in the non-pixel region, and wherein the power supply line is simultaneously formed with the gate electrodes.

14. A method of making a flat panel display device comprising a CMOS thin film transistor (TFT), the method comprising:

providing a substrate;

forming a first gate electrode and a second gate electrode over the substrate;

forming an insulating layer over the substrate and the first and second gate electrodes;

forming a semiconductor layer over the insulating layer;

forming a conductive layer over the semiconductor layer, wherein the conductive layer comprises at least two sublayers stacked over one another, and wherein forming the conductive layer comprises etching portions of the at least two sublayers in a single etching process;

forming a photoresist mask having a first pattern over the semiconductor layer;

selectively etching the semiconductor layer using the first pattern of the photoresist mask so as to form a first semiconductor layer and a second semiconductor layer, wherein at least a portion of the first semiconductor layer overlies the first gate electrode, and wherein at least a portion of the second semiconductor layer overlies the second gate electrode;

projecting light to the first pattern of the photoresist mask in a direction such that the light passes through the substrate before reaching the first pattern of the photoresist mask, wherein the first and second gate electrodes block the light directed thereto, and wherein the light illuminates at least one portion of the first pattern of the photoresist mask;

removing the at least one portion of the first pattern of the photoresist mask illuminated by the light, thereby forming a second pattern in the photoresist mask, wherein the second pattern is different from the first pattern; and selectively doping the first and second semiconductor layers with the second pattern of the photoresist mask, the first and second semiconductor layers having been previously formed with the first pattern of the photoresist mask, wherein doping the first and second semiconductor layers comprises injecting impurities into portions of the first and second semiconductor layers that are not overlapping the second pattern of the photoresist mask, wherein the impurities comprise n-type dopants, and wherein the method further comprises, after injecting the n-type dopants:

removing at least a portion of the second pattern of the photoresist mask, thereby forming a third pattern in the photoresist mask; and further doping the first semiconductor layer using the third pattern of the photoresist mask.

15. The method of claim 14, wherein further doping comprises injecting impurities into the first semiconductor layer, thereby forming lightly-doped drain (LDD) regions and a channel region interposed between the LDD regions.

16. The method of claim 14, wherein removing the at least a portion of the second pattern of the photoresist mask comprises using dry ashing or wet ashing.

17. The method of claim 14, further comprising:

forming a fourth photoresist mask over substantially the entire portion of the first semiconductor layer and over a central portion of the second semiconductor layer, the central portion overlying the second gate electrode; and injecting p-type dopants into the second semiconductor layer using the fourth photoresist mask.

18. A method of making a flat panel display device, the method comprising:

forming a semiconductor layer over a substrate;

forming a conductive layer over the semiconductor layer, wherein the conductive layer comprises at least two sublayers stacked over one another, and wherein forming the conductive layer comprises etching portions of the at least two sublayers in a single etching process;

forming a mask over the semiconductor layer;

removing a portion of the semiconductor layer with the mask;

modifying the mask; and doping at least some of the semiconductor layer with the modified mask.

* * * * *